United States Patent
Maleki et al.

(10) Patent No.: US 11,152,681 B2
(45) Date of Patent: Oct. 19, 2021

(54) METHODS AND DEVICES FOR EVANESCENTLY COUPLING LIGHT HAVING DIFFERENT WAVELENGTHS TO AN OPEN DIELECTRIC RESONATOR

(71) Applicant: OEWAVES, INC., Pasadena, CA (US)

(72) Inventors: Lute Maleki, Pasadena, CA (US); Anatoliy A. Savchenko, Glendale, CA (US); Danny Eliyahu, Pasadena, CA (US); Wei Liang, Monrovia, CA (US); Vladimir S. Ilchenko, Arcadia, CA (US); Andrey B. Matsko, Pasadena, CA (US)

(*) Notice: Subject to any disclaimer, the term of this patent is extended or adjusted under 35 U.S.C. 154(b) by 502 days.

(21) Appl. No.: 15/997,627

(22) Filed: Jun. 4, 2018

(65) Prior Publication Data

US 2019/0372193 A1 Dec. 5, 2019
US 2020/0313270 A9 Oct. 1, 2020

Related U.S. Application Data

(60) Provisional application No. 62/519,029, filed on Jun. 13, 2017.

(51) Int. Cl.
| | |
|---|---|
| *G02B 6/26* | (2006.01) |
| *H01P 7/10* | (2006.01) |
| *H01S 3/00* | (2006.01) |
| *G02B 6/293* | (2006.01) |
| *G02B 6/12* | (2006.01) |

(52) U.S. Cl.
CPC .............. *H01P 7/10* (2013.01); *G02B 6/29332* (2013.01); *H01S 3/0085* (2013.01); *G02B 2006/12114* (2013.01)

(58) Field of Classification Search
CPC ...... G02B 2006/12114; G02B 6/29332; G02B 6/29341; G02B 6/26; H01P 7/10; H01S 3/0085

See application file for complete search history.

(56) References Cited

U.S. PATENT DOCUMENTS

| | | | | |
|---|---|---|---|---|
| 6,879,752 | B1* | 4/2005 | Ilchenko | G02B 6/12007 385/30 |
| 7,043,115 | B2* | 5/2006 | Frick | B82Y 20/00 333/219.1 |
| 2002/0172457 | A1* | 11/2002 | Tapalian | G02B 6/12002 385/30 |
| 2011/0080579 | A1* | 4/2011 | Pipino | G01N 21/7746 356/301 |
| 2011/0253897 | A1* | 10/2011 | Saeedkia | G01N 21/3581 250/358.1 |
| 2012/0281957 | A1* | 11/2012 | Chamanzar | G02B 6/12007 385/131 |

* cited by examiner

*Primary Examiner* — Jennifer Doan

(57) ABSTRACT

One feature pertains to an apparatus that includes apparatus that includes an evanescent field coupler having a first surface that evanescently couples light between the evanescent field coupler and an open dielectric resonator. The apparatus also includes a thin film coating covering at least a portion of the first surface of the evanescent field coupler. The thin film coating is specifically designed so that the thin film coating reflects light of a first wavelength.

19 Claims, 13 Drawing Sheets

METHODS AND DEVICES FOR EVANESCENTLY COUPLING LIGHT HAVING DIFFERENT WAVELENGTHS TO AN OPEN DIELECTRIC RESONATOR

CLAIM OF PRIORITY

The present application for patent claims priority to provisional application No. 62/519,029 entitled "Scheme for Efficient Coupling of Light with Different Wavelength to the Same Open Resonator" filed Jun. 13, 2017, the entire disclosure of which is hereby expressly incorporated by reference.

FIELD

Various aspects of the present disclosure relate to photonics and, more particularly, to methods and apparatuses for equalized evanescent coupling of light having different wavelengths to an open dielectric resonator.

INTRODUCTION

Many opto-electronic devices utilize evanescent field couplers to evanescently couple light into and out of optical resonators including whispering gallery mode resonators (WGMR). For example, an opto-electronic device may include a coherent light source, an evanescent field coupler, and a WGMR. The light source may generate predominately two different wavelengths of light that pass through the coupler and evanescently couple into the WGMR positioned very close to the coupler.

The distance at which the coupler and the WGMR are spaced apart is critical and has a significant impact on the coupling efficiency. Notably, the optimal distance d selected to maximize coupling between the coupler and WGMR is dependent upon the wavelength of the light being coupled. Selecting the distance d between the coupler and WGMR to maximize coupling of light at a first wavelength may not efficiently couple light at a significantly different second wavelength. The effect occurs due to the wavelength dependence of the evanescent field of the light confined in the resonator, so that high efficiency coupling of longer wavelength optical fields prevents high efficiency coupling of shorter wavelength optical fields, and vice versa. Consequently, those wavelengths of light exhibiting higher efficiency coupling than other wavelengths of light may have loaded quality factors and load bandwidth values that vary by orders of magnitude from one another.

There is a need for devices and methods that enable equalization of the coupling efficiency into and out of an open dielectric resonator for different wavelengths of light while keeping the distance between the coupler and resonator fixed. Such devices and methods would allow the resonator to exhibit a loaded quality factor, loaded bandwidth, and loaded finesse values that are relatively close (e.g., less than a factor of 4) for two or more different wavelengths of light.

SUMMARY

One feature provides an apparatus comprising an evanescent field coupler having a first surface configured to evanescently couple light between the evanescent field coupler and an open dielectric resonator, and a thin film coating covering at least a portion of the first surface of the evanescent field coupler and configured to increase reflection of light of a first wavelength. According to one aspect, the thin film coating is configured to increase reflection of light of the first wavelength relative to light of a second wavelength that is different than the first wavelength. According to another aspect, the thin film coating includes a plurality of layers.

According to one aspect, the plurality of layers include a first set of layers composed of a first material and a second set of layers composed of a second material, the first set of layers interleaved with the second set of layers to form an alternating layer structure. According to another aspect, the first material and the second material have different indexes of refraction, and the refractive index of the first material, the refractive index of the second material, and a selected thickness of each layer of the plurality of layers cause constructive interference of light of the first wavelength at the thin film coating to increase reflection of light of the first wavelength when light of the first wavelength is incident upon the first surface of the coupler and/or a surface of the open dielectric resonator at a grazing angle less than 0.1 radians. According to yet another aspect, the plurality of layers each have at least one of a different thickness and/or a different index of refraction.

According to one aspect, the thin film coating is configured to increase reflection of light of the first wavelength when light of the first wavelength is incident upon the first surface of the coupler and/or a surface of the open dielectric resonator at a grazing angle less than 0.1 radians. According to another aspect, the thin film coating operates as a wavelength selective dielectric mirror that reflects more than 90% of the power of the light of the first wavelength. According to yet another aspect, the thin film coating is further configured to decrease the coupling efficiency of light of the first wavelength and boost loaded quality factor Q of light of the first wavelength propagating within the open dielectric resonator. According to another aspect, the evanescent field coupler is a prism or a waveguide.

Another feature provides a method comprising providing an evanescent field coupler having a first surface configured to evanescently couple light out from the evanescent field coupler and into an open dielectric resonator and couple light out from the open dielectric resonator and into the evanescent field coupler, selecting a first wavelength of light, and applying a thin film coating to at least a portion of the first surface of the evanescent field coupler, the thin film coating configured to enhance reflection of light of the first wavelength. According to one aspect, the method further comprises selecting and adjusting one or more thin film coating properties of the thin film coating to enhance reflection of light of the first wavelength. According to another aspect, the thin film coating properties include a number of layers of the thin film coating, a material for each layer of the thin film coating, an index of refraction for each layer of the thin film coating, and a thickness for each layer of the thin film coating.

According to one aspect, the thin film coating is configured to increase reflection of light of the first wavelength relative to light of a second wavelength that is different than the first wavelength. According to another aspect, applying a thin film coating includes forming a plurality of alternating layers over the portion of the first surface of the evanescent field coupler. According to yet another aspect, the plurality of alternating layers are each composed of one of two different materials and each layer of the plurality of layers has a different thickness. According to another aspect, applying a thin film coating includes forming a plurality of layers over the portion of the first surface of the evanescent field coupler, each layer of the plurality of layers having a different index of refraction for a given wavelength of light.

Another feature provides a system comprising a light source configured to generate coherent light having a first wavelength and a second wavelength, the second wavelength substantially different than the first wavelength, an open dielectric resonator, and an evanescent field coupler having a first surface configured to evanescently couple light between the evanescent field coupler and the open dielectric resonator and a second surface through which the evanescent field coupler transmits and receives light to and from the light source, wherein the evanescent field coupler's first surface includes a thin film coating that is configured to decrease light coupling efficiency between the evanescent field coupler and the open dielectric coupler for light of the first wavelength relative to light coupling efficiency of the second wavelength, and the thin film coating further configured to boost loaded quality factor Q for light of the first wavelength within the open dielectric resonator. According to one aspect, the open dielectric resonator is a monolithic whispering gallery mode resonator. According to another aspect, the thin film coating includes a plurality of layers for which thin film coating properties are selected to increase reflectance of light of the first wavelength through the thin film coating relative to light of the second wavelength through the thin film coating.

DETAILED DESCRIPTION

Figure 1:
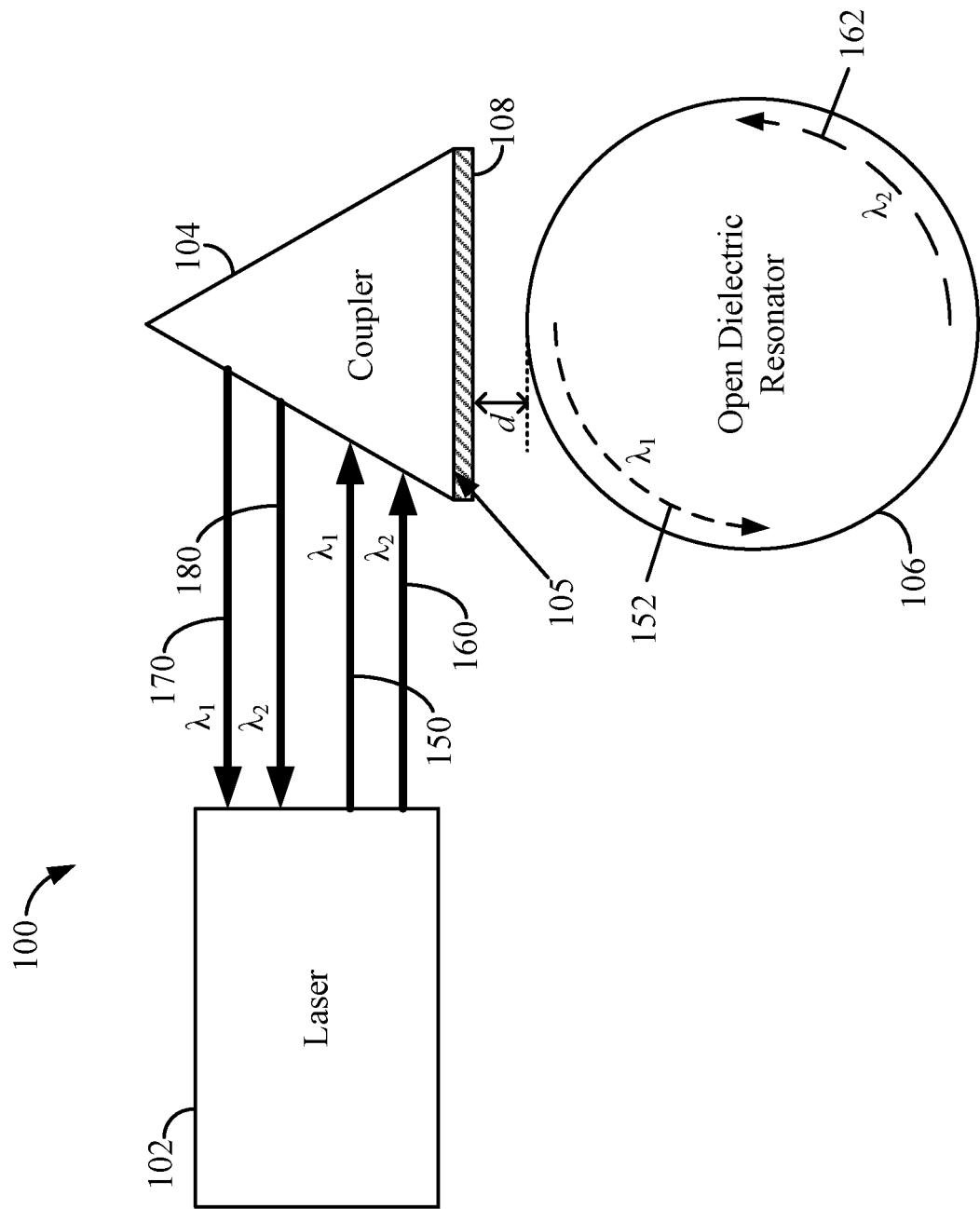
FIG. 1 illustrates a schematic view of a system for evanescently coupling light into and out of an open dielectric resonator.

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The word "exemplary" is used herein to mean "serving as an example, instance, or illustration." Any implementation or aspect described herein as "exemplary" is not necessarily to be construed as preferred or advantageous over other aspects of the disclosure. Likewise, an aspect is an implementation or example. Reference in the specification to "an aspect," "one aspect," "some aspects," "various aspects," or "other aspects" means that a particular feature, structure, or characteristic described in connection with the aspects is included in at least some aspects, but not necessarily all aspects, of the present techniques. The various appearances of "an aspect," "one aspect," or "some aspects" are not necessarily all referring to the same aspects. Elements or aspects from an aspect can be combined with elements or aspects of another aspect.

Not all components, features, structures, characteristics, etc. described and illustrated herein need be included in a particular aspect or aspects. If the specification states a component, feature, structure, or characteristic "may", "might", "can" or "could" be included, for example, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

It is to be noted that, although some aspects have been described in reference to particular implementations, other implementations are possible according to some aspects. Additionally, the arrangement and/or order of circuit elements or other features illustrated in the drawings and/or described herein need not be arranged in the particular way illustrated and described. Many other arrangements are possible according to some aspects.

In each figure, the elements in some cases may each have a same reference number or a different reference number to suggest that the elements represented could be different and/or similar. However, an element may be flexible enough to have different implementations and work with some or all of the systems shown or described herein. The various elements shown in the figures may be the same or different. Which one is referred to as a first element and which is called a second element is arbitrary.

FIG. 1 illustrates a schematic view of a system 100 for evanescently coupling light into and out of an open dielectric resonator according to one aspect. The system 100 includes a coherent light source 102 (e.g., laser), an evanescent field coupler 104, and an open dielectric resonator 106. In the example shown, the laser 102 generates light 150, 160 composed of predominately two different wavelengths $\lambda_1$ and $\lambda_2$ (i.e., wavelengths in vacuum) where $\lambda_1 < \lambda_2$. For instance, as one non-limiting, non-exclusive example, the first wavelength $\lambda_1$ of light may be 795 nm and the second wavelength $\lambda_2$ of light may be 1550 nm. The light 150, 160 generated by the laser 102 passes through the coupler 104 (e.g., through the coupler's "second surface") and strikes a bottom surface 105 (e.g., "first surface") of the coupler 104. The close proximity of the resonator 106 at a fixed distance d away from the coupler 104 causes the light's evanescent field at the coupler's bottom surface 105 to excite propagating (e.g., circulating) light waves 152, 162 in the resonator 106 having the same wavelengths $\lambda_1$ and $\lambda_2$. By a similar process, evanescent fields associated with the light 152, 162 circulating within the resonator 106 causes light 170, 180 to be evanescently coupled out from the resonator 106 back to the coupler 104, which may then travel back to the laser 102 as shown. In some aspects, a lens assembly (not shown) may be placed between the optical coupler 104 and the laser 102 to help direct the light back to the laser 102.

The loaded quality factor Q of an open dielectric resonator depends on many factors including the type and shape of the resonator. For example, the loaded quality factor Q of a spherical resonator may be approximated by the formula:

$$Q \approx \frac{\pi}{2} \frac{n_p}{n_r} \frac{n_r^2 - 1}{\sqrt{n_p^2 - n_r^2}} l^{1/2} e^{\left(\frac{4\pi d}{\lambda}\sqrt{n_r^2 - 1}\right)}$$

where $n_p$ and $n_r$ are the wavelength ($\lambda$) dependent refractive indexes of the coupler and the resonator, l is the azimuthal index of the whispering gallery mode, and d is the shortest distance from the coupler's surface to the resonator. It may be observed that for a fixed distance d between the coupler and the resonator, the loaded quality factor (Q) of the resonator decreases as the wavelength $\lambda$ of light increases. Thus, in the example shown in FIG. 1, since the distance d between the resonator 106 and the coupler 104 is fixed, the loaded quality factor Q of the resonator 106 would ordinarily have significantly different values for the two different wavelengths $\lambda_1$ and $\lambda_2$ of light that are evanescently coupled to it. Specifically, the loaded quality factor Q for the longer wavelength $\lambda_2$ of light would be orders of magnitude less than the loaded quality factor Q for the shorter wavelength $\lambda_1$ of light.

To help equalize the loaded quality factor Q values of the resonator for light having different wavelengths $\lambda_1$ and $\lambda_2$, the evanescent field coupler 104 shown in FIG. 1 features a thin film coating 108 on at least a portion of its bottom surface 105 that is closest to the resonator 106 where light is evanescently coupled between the coupler 104 and the resonator 106. As described in greater detail below, the thin film coating 108, which may be generally planar, is specifically designed to increase reflectivity of the longer $\lambda_2$ wavelength light relative to the shorter wavelength $\lambda_1$ light in order to decrease the coupling efficiency for the longer $\lambda_2$ wavelength light between the coupler 104 and the resonator 106. Accordingly, the thin film coating 108 acts as an equalizer that controls the coupling efficiency of light having different wavelengths. By reducing the coupling efficiency of the longer $\lambda_2$ wavelength light, the thin film coating 108 boosts the loaded quality factor Q of the longer $\lambda_2$ wavelength light so that it better matches the loaded quality factor Q of the shorter wavelength $\lambda_1$ light despite the distance d being fixed between the coupler 104 and the resonator 106.

Figure 2:
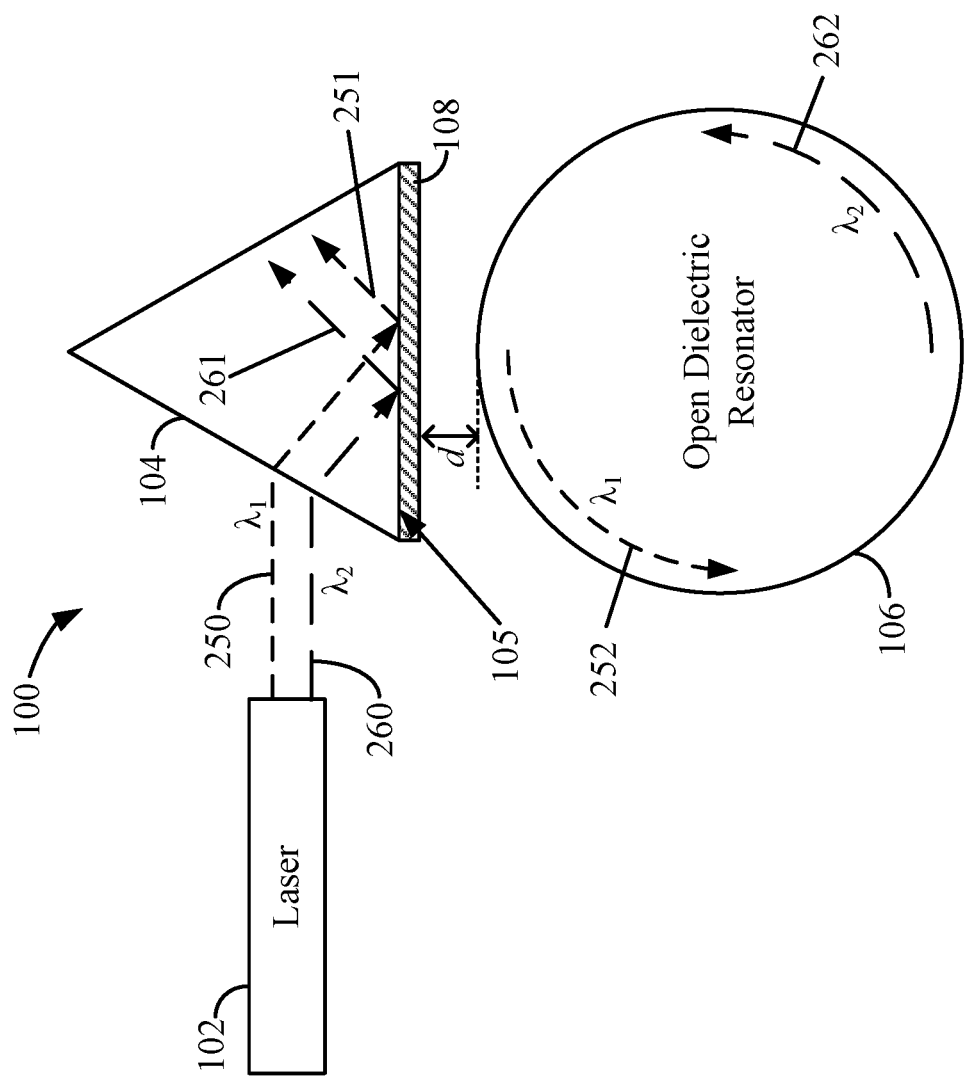
FIG. 2 illustrates the system's coupler having a thin film coating that is configured to reflect light of a specific wavelength.

FIG. 2 illustrates the system's coupler 104 having a thin film coating 108 that is configured to reflect light of a specific wavelength according to one aspect. The laser 102 generates light 250, 260 composed of predominately two different wavelengths $\lambda_1$ and $\lambda_2$ (i.e., wavelengths in vacuum) where $\lambda_1 < \lambda_2$. For instance, as one non-limiting, non-exclusive example, the first wavelength $\lambda_1$ of light may be 795 nm and the second wavelength $\lambda_2$ of light may be 1550 nm. The light 250, 260 generated by the laser 102 passes through the coupler 104 and strikes a bottom surface 105 of the coupler 104 having the thin film coating 108. In the example shown, the thin film coating is specifically designed with thin film coating properties (e.g., thickness of layers, materials used for the layers, indexes of refraction of the layers, number of layers, etc.) to reflect a significantly larger percentage of the longer $\lambda_2$ wavelength light's energy 261 than the shorter wavelength $\lambda_1$ light's energy 251. For instance, the thin film coating 108 may reflect about 65% of the first wavelength $\lambda_1$ light's energy but it may reflect more than 99% of the second wavelength $\lambda_2$ light's energy. Thus, only a small fraction of the second wavelength $\lambda_2$ of light 262 may evanescently couple into and out of the resonator 106 compared to the first wavelength $\lambda_1$ of light 261. Since the thin film coating 108 effectively makes it more difficult for the second wavelength $\lambda_2$ light propagating within the resonator 106 from being evanescently coupled out, the loaded quality factor Q for the second wavelength $\lambda_2$ light is boosted and may better match the loaded quality factor Q of the first wavelength)$\lambda_1$ light.

Figure 3:
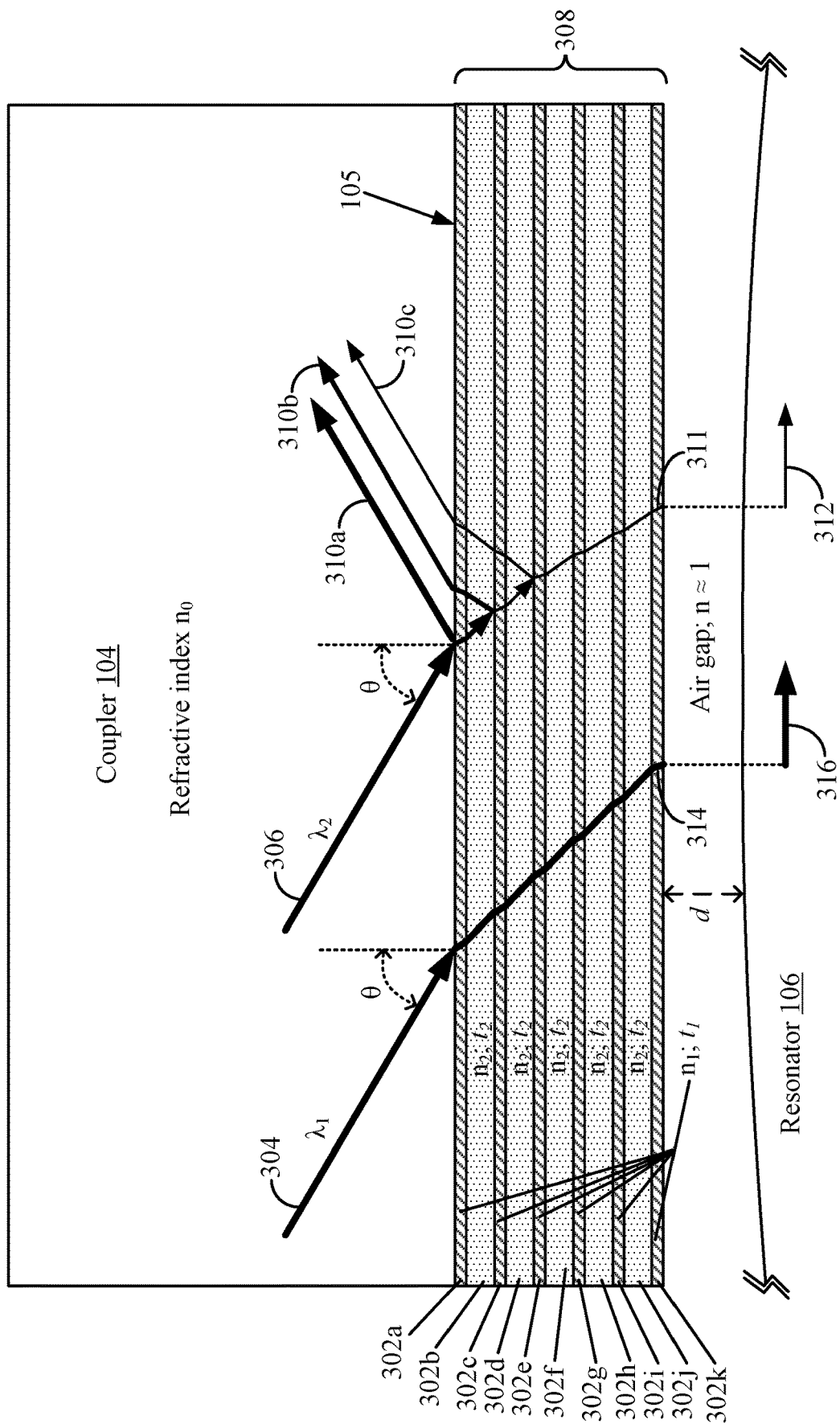
FIG. 3 illustrates a schematic representation of a cross-section of the evanescent field coupler, a thin film coating, and resonator.

FIG. 3 illustrates a schematic representation of a cross-section of the evanescent field coupler 104, a thin film coating 308, and resonator 106 according to one aspect. The thin film coating 308 may operate as a dielectric mirror (e.g., Bragg mirror, quarter-wave mirror, dichroic mirror, etc.) that has been designed so that it reflects substantially more light at a second wavelength $\lambda_2$ (e.g., wavelength in vacuum) than light at a first wavelength $\lambda_1$ (e.g., wavelength in vacuum). As such, according to one non-limiting, non-exclusive example, the thin film coating 308 may comprise a plurality of alternating layers 302a, 302b, . . . 302k where a first set of layers 302a, 302c, . . . 302k, each composed of a first type of material having a first index of refraction (e.g., high-index of refraction $n_1$) and a first thickness ($t_1$), are interleaved with a second set of layers 302b, 302d, . . . 302j each composed of a second type of material having a second index of refraction (e.g., low-index of refraction $n_2$) and a second thickness ($t_1$).

The alternating layers 302a, 302b, . . . 302k have thicknesses $t_1$, $t_2$ and refractive indexes $n_1$, $n_2$ that have been specifically selected so that the path-length differences for reflections 310a, 310b, 310c from different high-index $n_1$ layers are integer multiples of the wavelength $\lambda_2$ for which the thin film coating 308 is designed to reflect. The reflections from the low-index $n_2$ layers may also have exactly half a wavelength $\lambda_2$ in path length difference compared to high-index $n_1$ layer reflections, but there is a 180-degree difference in phase shift at a low-to-high index boundary, compared to a high-to-low index boundary, which means that the low-index $n_2$ reflections are also in phase. This causes constructive interference of the second wavelength $\lambda_2$ light reflected at the boundary interfaces (e.g., reflected light 310a, 310b, 310c, etc.) of the plurality of alternating layers 302a, 302b, . . . 302k, which results in a very large portion of the second wavelength $\lambda_2$ light reflecting away. Thus, only a very small percentage of the second wavelength $\lambda_2$ light may actually reach the bottom layer 302k and be evanescently coupled into the resonator 106.

By contrast, the optical path lengths through each of the alternating layers 302a, 302b, . . . 302k for the first wavelength $\lambda_1$ light is not specifically designed to promote reflection and thus there is significantly less constructive interference of $\lambda_1$ wavelength light at the coupler's bottom surface 105. Such $\lambda_1$ wavelength light may therefore pass through the thin film coating 308 with substantially less reflective power loss and a greater portion of this light may reach the bottom layer 302k of the thin film coating 308 and be evanescently coupled into the resonator 106.

Referring to FIGS. 2 and 3, light 304, 306 generated by the laser 102 and composed of two different wavelengths $\lambda_1$ (e.g., 795 nm in vacuum) and $\lambda_2$ (1550 nm in vacuum) may propagate through the coupler 104 (e.g., BK7 having refractive index $n_0$=1.51) and be incident on the bottom surface 105 of the coupler 104 at an angle θ from the normal to the coupler's bottom surface 105. According to one non-limiting example, the thin film coating 308 may be comprised of a series of alternating layers 302a, 302b, . . . 302k of silicon oxide $SiO_2$ and titanium oxide $TiO_2$. The $SiO_2$ layers 302b, 302d, . . . 302j may have a refractive index $n_1$ of about 1.44, while the $TiO_2$ layers 302a, 302c, . . . 302k may have a refractive index $n_2$ of about 2.45. These specific materials and refractive indexes used are merely exemplary and in aspects of the disclosure of materials and/or different refractive indexes may be used to achieve the same goal of reflecting light at one wavelength while allowing light of another wavelength to pass through.

The alternating series of layers 302a, 302b, . . . 302k have thicknesses $t_1$, $t_2$ so that the path-length differences for reflections 310a, 310b, 310c from different high-index $n_1$ layers are integer multiples of the wavelength $\lambda_2$ for which the thin film coating 308 is designed to reflect. The reflections from the low-index $n_2$ layers also have exactly half a wavelength $\lambda_2$ in path length difference compared to high-index $n_1$ layer reflections, but there is a 180-degree difference in phase shift at a low-to-high index boundary, compared to a high-to-low index boundary, which means that the low-index $n_2$ reflections are also in phase. This causes constructive interference of the second wavelength $\lambda_2$ light reflected at the boundary interfaces (e.g., reflected light 310a, 310b, 310c, etc.) of the plurality of alternating layers 302a, 302b, . . . 302k, which results in a very large portion of the second wavelength $\lambda_2$ light reflecting away. Thus, only a very small percentage of the second wavelength $\lambda_2$ light actually reaches the bottom layer 302k and be evanescently coupled 311 into the resonator 106.

By contrast, the optical path lengths through each of the alternating layers 302a, 302b, . . . 302k for first wavelength $\lambda_1$ light 304 is not designed to constructively interfere. This light 304 may thus pass through the thin film coating 308 with substantially less power lost to reflection and a greater portion 314 of such light may reach the bottom layer 302k of the thin film coating 308 and be evanescently coupled 316 into the resonator 106.

In the example illustrated in FIG. 3, a thin film coating 308 is shown having 11 layers 302a, 302b, . . . 302k. This is merely an example and in practice the thin film coating 308 may have less layers or more layers. Moreover, the dual alternating $SiO_2/TiO_2$ layer structure shown is also merely exemplary. In practice, different types of layer materials may be used and more than two different types may be used. Furthermore, the alternating layers 302a, 302b, . . . 302k may each have different thicknesses and are not limited to alternating thicknesses $t_1$ and $t_2$. Generally, many different types of layer materials, layering structures, number of layers, refractive indexes of the layers, etc. may be used to form the thin film coating 308. Whatever specific implementation of the thin film coating 308 is used, the thin film coating 308 should be specifically designed to cause significantly more constructive reflection of one or more wavelengths of light over other one or more wavelengths of light in order to selectively control the coupling efficiency of different wavelengths of light between the coupler 104 and the resonator 106.

Figure 4:
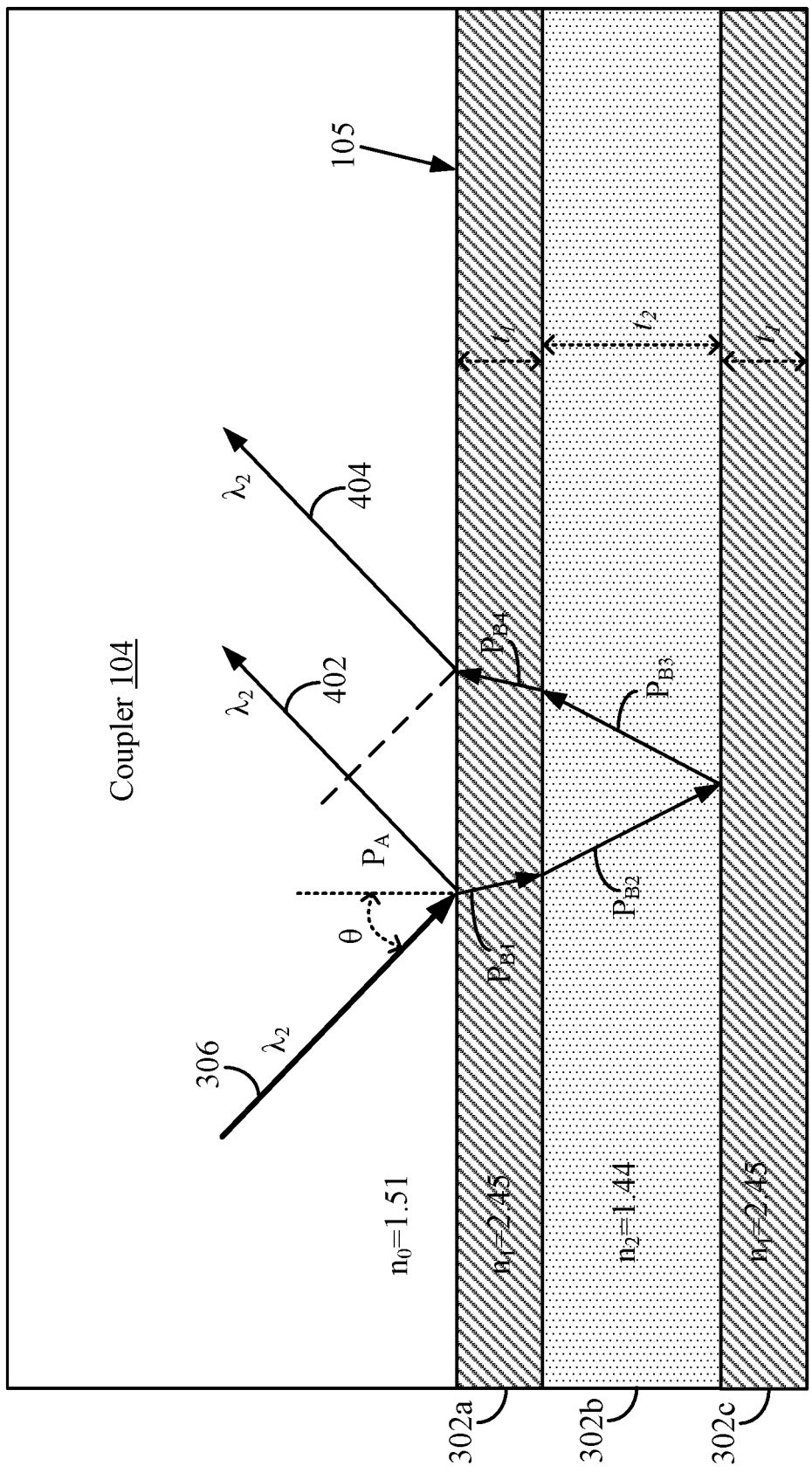
FIG. 4 illustrates a close up view of a portion of a cross-section of the thin film coating shown in FIG. 3.

FIG. 4 illustrates a close up view of a portion of a cross-section of the thin film coating 308 shown in FIG. 3 according to one aspect. Light 306 having a wavelength $\lambda_2$ (in vacuum) may be incident on the evanescent field coupler's bottom surface 105 at an angle θ to the normal of the coupler's bottom surface 105. A first portion 402 of the light's energy is reflected off at the interface boundary between the coupler 104 and the first thin film coating layer 302a while a portion of the light's energy is transmitted through into the first layer 302a according to Fresnel's equations.

The portion of the light transmitted through into the first layer 302a follows an optical path $P_{B1}$ whose length is given by Snell's law as $n_1 * t_1 / \cos[\sin^{-1}((n_0/n_1)*\sin(\theta))]$. The light continues through the thin film coating 308 entering into the second thin film coating layer 302b. The portion of the light transmitted through into the second layer 302b follows an optical path $P_{B2}$ whose length is given by Snell's law as $n_2 * t_2 / \cos[\sin^{-1}((n_1/n_2)*\sin[\sin^{-1}((n_0/n_1)*\sin(\theta))])]$.

A portion of the light traveling through the second layer 302b reflects off of the interface boundary between the second layer 302b and the third layer 302c and travels back through the second layer 302b along an optical path $P_{B3}$ whose length is equal to $P_{B2}$. A portion of the light traveling back through the second layer 302b along the optical path $P_{B3}$ enters back into the first layer 302a and travels through the first layer 302a along an optical path $P_{B4}$ whose length is equal to $P_{B1}$. A portion of this light propagating back through the first layer 302a exits the first layer 302a back into the coupler 104 and represents a second reflected portion 404 of the light's 306 energy.

The optical path difference (OPD) between the first reflected portion 402 and the second reflected portion 404 is given by the formula:

$$OPD = P_{B1} + P_{B2} + P_{B3} + P_{B4} - P_A.$$

In order to facilitate constructive interference of the first and second reflected portions 402, 404 of light, the thin film coating layers 302a, 302b may be designed so that the OPD is an integer multiple of the wavelength $\lambda_2$. For instance, if the OPD is one wavelength $\lambda_2$ in distance then constructive interference between the first and second reflected portions 402, 404 will be realized. Referring to FIGS. 3 and 4, the remaining thin film coating layers 302c-302k may be similarly designed (e.g., thickness, material, index of refraction) so that second wavelength $\lambda_2$ light traveling into these layers similarly results in reflective constructive interference Similar design considerations may also be used to ensure that reflections from the low-index $n_2$ layers (i.e., interface boundaries between first and second layers 302a, 302b, third and fourth layers 302c, 302d, fifth and sixth layers 302e, 302f, etc.) also constructively interfere. To do so, these layers have exactly half a wavelength $\lambda_2$ in path length difference compared to high-index $n_1$ layer reflections to account for a 180-degree difference in phase shift at a low-to-high index boundary.

Figure 5:
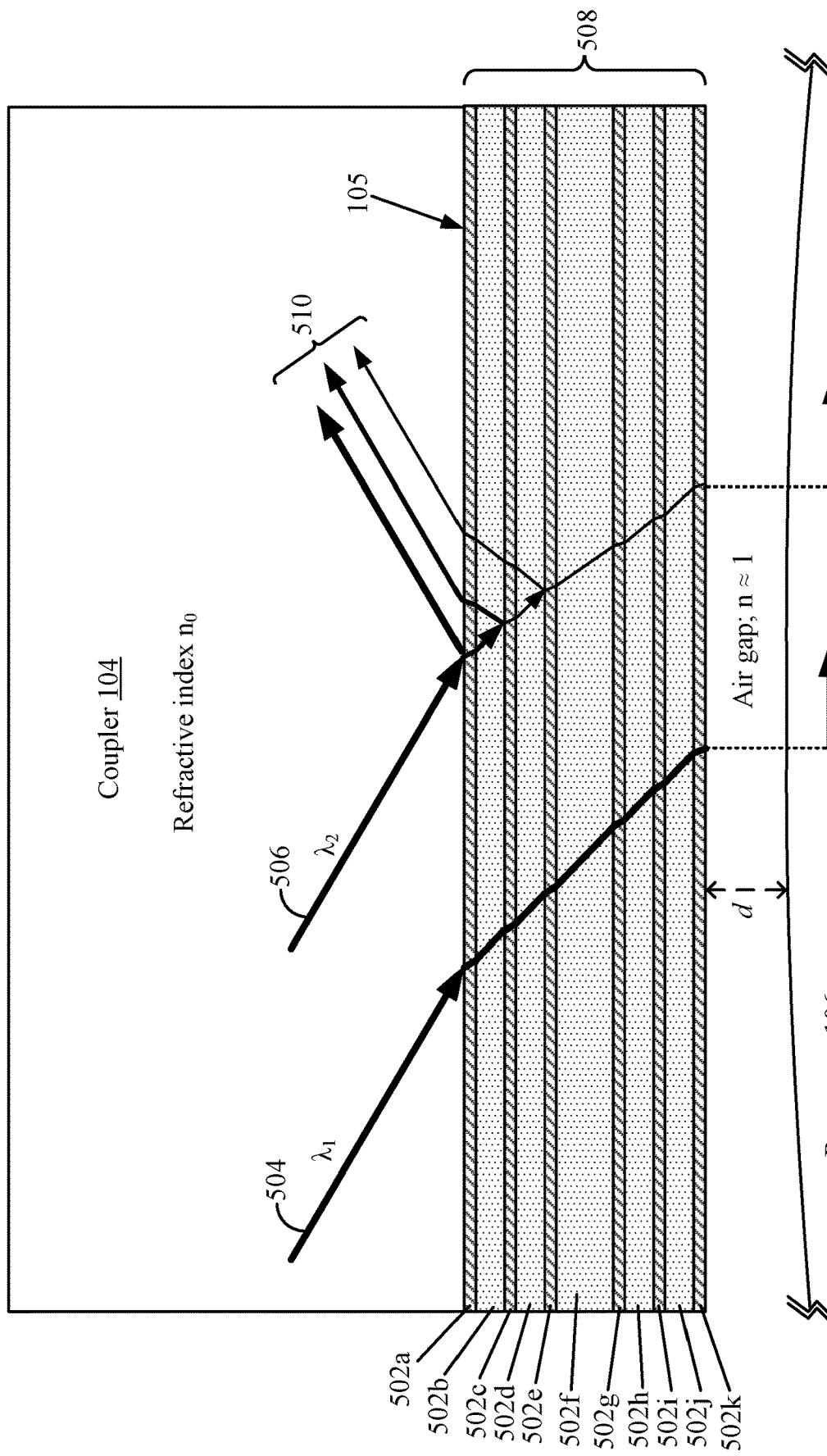
FIG. 5 illustrates a schematic representation of a cross-section of a thin film coating.

FIG. 5 illustrates a schematic representation of a cross-section of a thin film coating 508 according to one aspect of the disclosure. Similar to the thin film coating 308 shown and described with respect to FIG. 3, the thin film coating 508 shown in FIG. 5 is composed of a plurality of alternating layers 502a, 502b, . . . 502k that operate as a dielectric mirror that reflects 510 substantially more light at a second wavelength $\lambda_2$ 506 than light at a first wavelength $\lambda_1$ 504. However, the layers 502a, 502b, . . . 502k may have different thicknesses from one another and/or have different indexes of refraction. The specific thickness and index of refraction for each layer 502a, 502b, 502k may be selected so that the coating 508 as a whole substantially reflects 510 longer wavelength light 506, such as $\lambda_2$ wavelength light, but allows shorter wavelength light 504, such as $\lambda_1$ wavelength light, to pass through the coating 508. That is, the collection of layers 502a, 502b, . . . 502k work together to cause constructive interference of longer wavelength light at the interlayer boundaries and reflect the longer wavelength light.

In some aspects, the same material may be used in alternating layers (e.g., $SiO_2$ and $TiO_2$) so that alternating layers have the same index of refraction but each has a different thickness. In other aspects, the thickness of each layer may be the same but the index of refraction for each layer may be different. Computer simulations may be used to determine and select thin film coating properties such as layer thicknesses, layer materials, indexes of refraction of the layers, and number of layers.

Tables 5-1, 5-2, and 5-3 below provide details of one non-limiting, non-exclusive example of a thin film coating that has been specifically designed and validated to reflect longer wavelength light (1550 nm) and transmit shorter wavelength light (795 nm). In the example provided the coating has 19 alternating layers that alternate between $SiO_2$ and $TiO_2$.

TABLE 5-1

Layer Thicknesses

Coupler Material BK7 (n = 1.51)
Layer 1 ($TiO_2$) - 620.44 nm
Layer 2 ($SiO_2$) - 418.03 nm
Layer 3 ($TiO_2$) - 376.20 nm
Layer 4 ($SiO_2$) - 746.75 nm
Layer 5 ($TiO_2$) - 116.48 nm
Layer 6 ($SiO_2$) - 425.91 nm
Layer 7 ($TiO_2$) - 325.52 nm
Layer 8 ($SiO_2$) - 424.94 nm
Layer 9 ($TiO_2$) - 316.65 nm
Layer 10 ($SiO_2$) - 922.45 nm
Layer 11 ($TiO_2$) - 335.13 nm
Layer 12 ($SiO_2$) - 420.17 nm
Layer 13 ($TiO_2$) - 113.52 nm
Layer 14 ($SiO_2$) - 413.70 nm
Layer 15 ($TiO_2$) - 113.32 nm
Layer 16 ($SiO_2$) - 413.07 nm
Layer 17 ($TiO_2$) - 114.04 nm
Layer 18 ($SiO_2$) - 411.65 nm
Layer 19 ($TiO_2$) - 88.11 nm
Gap d - 200 nm
Resonator material $MgF_2$

TABLE 5-2

Refractive Index Profile for $SiO_2$ Layers vs. Wavelength

| Wavelength (nm) | Index-n | Index-k |
| --- | --- | --- |
| 434.26 | 1.47893 | 0.0 |
| 497.4 | 1.47391 | 0.0 |

TABLE 5-2-continued

Refractive Index Profile for $SiO_2$ Layers vs. Wavelength

| Wavelength (nm) | Index-n | Index-k |
| --- | --- | --- |
| 574.68 | 1.46883 | 0.0 |
| 695.13 | 1.46352 | 0.0 |
| 700.0 | 1.4635 | 0.0 |
| 850.0 | 1.452 | 0.0 |
| 1550.0 | 1.448 | 0.0 |

TABLE 5-3

Refractive Index Profile for $TiO_2$ Layers vs. Wavelength

| Wavelength (nm) | Index-n | Index-k |
| --- | --- | --- |
| 366.0 | 2.34269 | 0.008956 |
| 376.0 | 2.47584 | 0.00368 |
| 402.0 | 2.60693 | $3.0 \times 10^{-7}$ |
| 432.0 | 2.50478 | 0.0 |
| 472.0 | 2.42451 | 0.0 |
| 526.0 | 2.35817 | 0.0 |
| 604.0 | 2.33311 | 0.0 |
| 710.0 | 2.2722 | 0.0 |
| 876.0 | 2.2169 | 0.0 |
| 1560. | 2.2162 | 0.0 |

Figure 6:
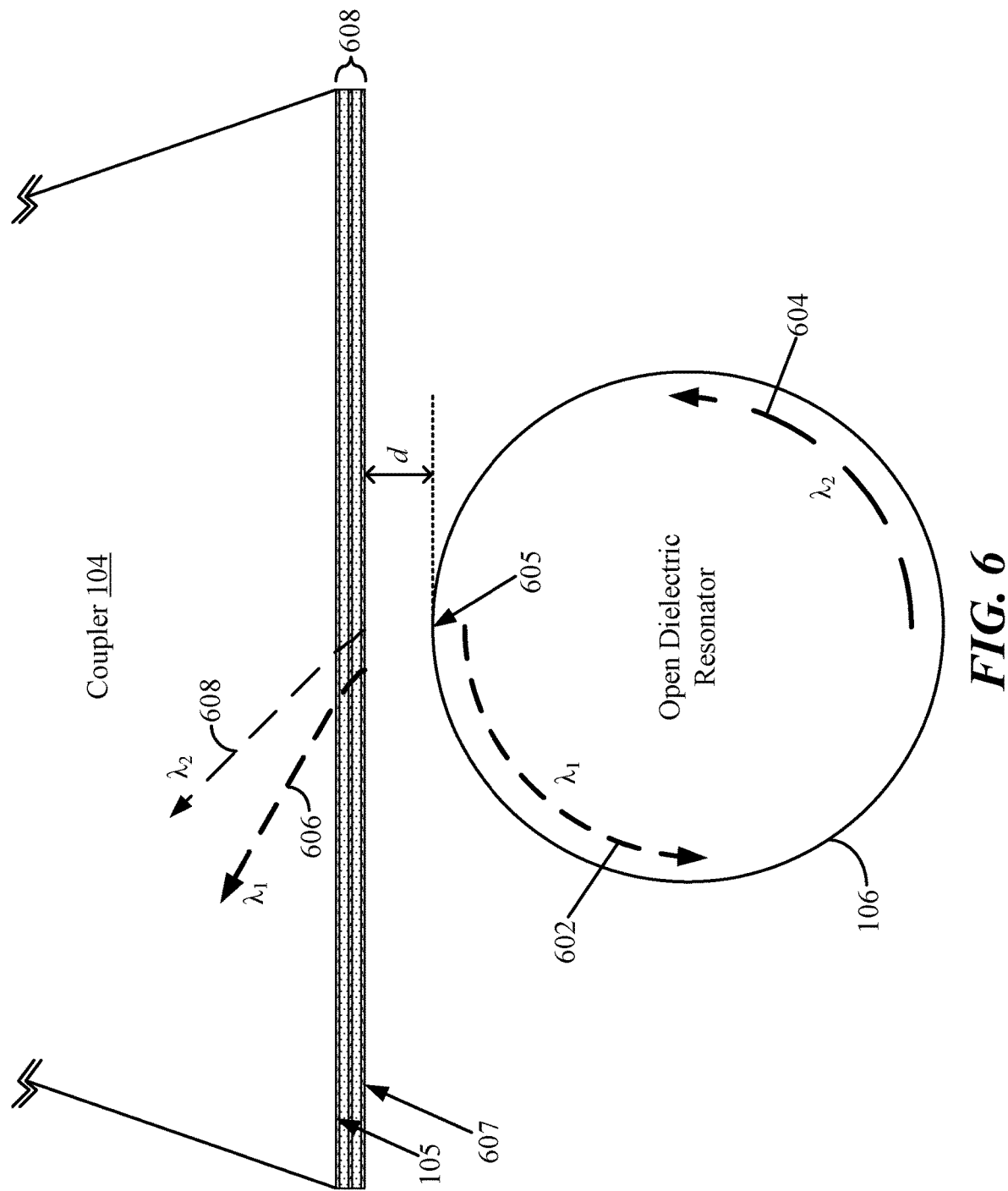
FIG. 6 illustrates a schematic view of the evanescent field coupler and the open dielectric resonator.

FIG. 6 illustrates a schematic view of the evanescent field coupler 104 and the open dielectric resonator 106 according to one aspect. The resonator 106 may have light 602, 604 of different wavelengths $\lambda_1$ and $\lambda_2$ circulating inside as shown. If the distance d between the coupler 104 and the resonator 106 is sufficiently small (e.g., less than a wavelength $\lambda_2$) then the evanescent fields at the surface 605 of the resonator 106 close to the coupler 104 cause corresponding light waves 606, 608 to be excited at thin film coating 608 (e.g., starting at the bottom surface 607 of the thin film coating 608) and propagate through the thin film coating 608 and coupler 104. Since the thin film coating 608 has been specifically designed to reflect second wavelength $\lambda_2$ light, less second wavelength $\lambda_2$ light 608 is evanescently coupled from the resonator 106 over to the thin film coating 608 and coupler 104 compared with $\lambda_1$ wavelength light 606.

Since less $\lambda_2$ wavelength light is evanescently coupled from the resonator 106 to the coupler 104 than wavelength $\lambda_1$ light, a greater amount of $\lambda_2$ wavelength light 604 remains circulating within the resonator 106 thereby boosting the loaded quality factor Q of the $\lambda_2$ wavelength light. This helps equalize the loaded quality factor Q between the two different wavelengths $\lambda_1$, $\lambda_2$ of light so that they are more equally matched. In this fashion, the thin film coating 608 operates symmetrically to reflect $\lambda_2$ wavelength light and transmit $\lambda_1$ wavelength light emanating from the resonator 106 towards the coupler 104 in addition to such light traveling from the coupler 104 to the resonator 106.

Figure 7:
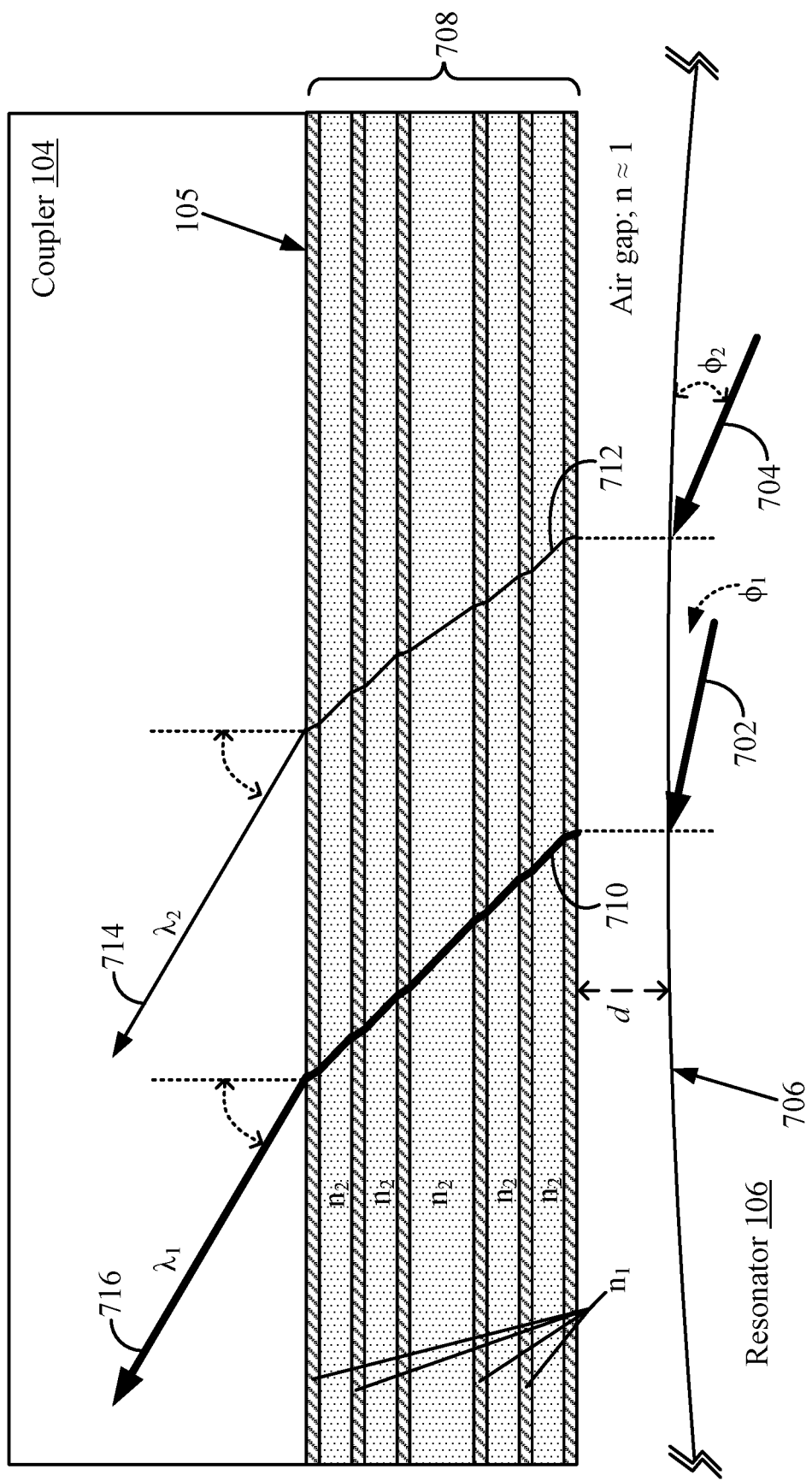
FIG. 7 illustrates another schematic view of the evanescent field coupler and the open dielectric resonator.

FIG. 7 illustrates another schematic view of the evanescent field coupler 104 and the open dielectric resonator 106 according to one aspect. Light 702, 704 circulating within the resonator 106 may strike the perimeter surface 706 of the resonator 106 at a small grazing angle $\phi$ approximated by $\phi = \lambda/2n_r * R$, where R is the radius of the resonator 106 (e.g., where the resonator is spherical), and $n_r$ is index of refraction of the resonator 106 (e.g., $MgF_2$ resonator). Thus, for $\lambda_1$=795 nm, R=0.1 mm $n_r$=1.38, $\phi_1$ is about $2.9 \times 10^{-3}$ radians and for $\lambda_2$=1550 nm, R=0.1 mm $n_r$=1.38, $\phi_2$ is about $5.6 \times 10^{-3}$ radians. The thin film coating 708 may be designed (e.g., thicknesses of the layers, number of layers, layer materials, refractive indexes of the layers, etc.) to reflect $\lambda_2$ wavelength light coming in at or about the grazing angle $\phi_2$ and transmit $\lambda_1$ wavelength light coming in at or about the grazing angle $\phi_1$. Conveniently, a thin film coating 708 designed to reflect $\lambda_2$ wavelength light at a grazing angle $\phi_2$ and transmit $\lambda_1$ wavelength light at a grazing angle $\phi_1$ may still be used with resonators having substantially smaller or larger radial dimensions (e.g., R is one order of magnitude larger or smaller) with negligible effect (e.g., <1%) on the reflection/transmittance frequency spectrum profile of the thin film coating.

The light 702, 704 within the resonator 106 may be evanescently coupled to the thin film coating 708 where it generates light 710, 712 that propagates through the thin film coating 708. Since the thin film coating 708 is designed to reflect $\lambda_2$ wavelength light 712, significantly less second wavelength $\lambda_2$ light 714 reaches and propagates through the coupler 104 (e.g., back toward the laser 102 (see FIG. 1)) than $\lambda_1$ wavelength light 716. Since less $\lambda_2$ wavelength light 704 is effectively coupled out of the resonator 106, the loaded quality factor Q of the $\lambda_2$ wavelength light is boosted to better match the loaded quality factor Q value of the $\lambda_1$ wavelength light.

The thin film coating 708 may be designed so that the power $P_2$ of the $\lambda_2$ wavelength light 714 transmitted from the resonator 106 to the coupler 104 is less than X % of the power $P_1$ of the $\lambda_1$ wavelength light 716 transmitted from the resonator 106 to the coupler 104. In some as aspects, where X may be any value between 0.1 and 90. For example, in some aspects, the thin film coating 708 may be designed so that the power $P_2$ of the $\lambda_2$ wavelength light 714 transmitted from the resonator 106 to the coupler 104 is less than 10% of the power $P_1$ of the $\lambda_1$ wavelength light 716 transmitted from the resonator 106 to the coupler 104.

Figure 8:
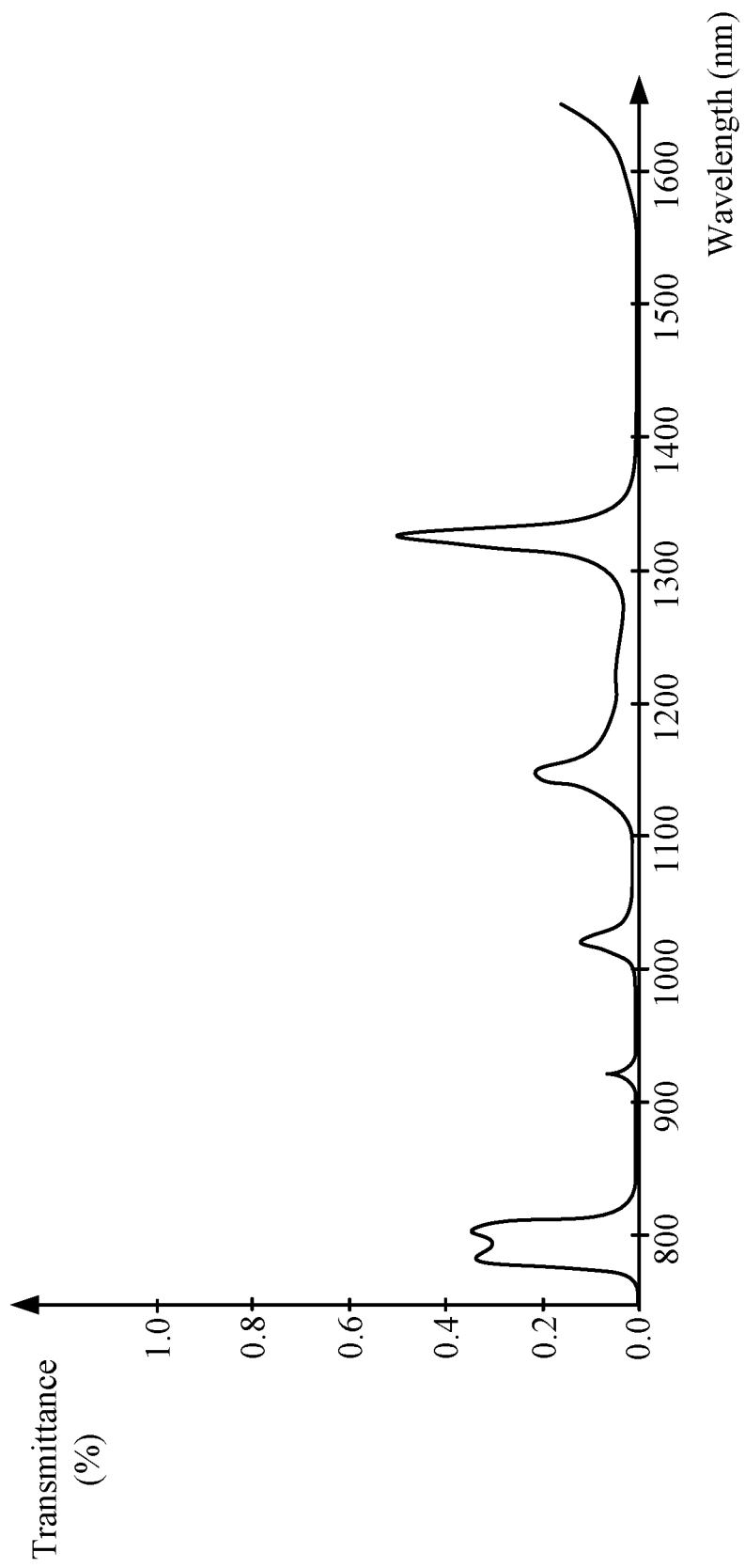
FIG. 8 illustrates an exemplary graph of the transmittance percentage versus light wavelength for an exemplary thin film coating that may be applied to a surface of a coupler.

FIG. 8 illustrates an exemplary graph (e.g., frequency transmittance profile) of the transmittance percentage versus light wavelength (nm) for an exemplary thin film coating 108, 308, 508, 608, 708 that may be applied to a surface of a coupler. In the example shown, the thin film coating 108, 308, 508, 608, 708 has been designed to reflect a large percentage (e.g., 99%) of light at or about 1550 nm while still allowing a significant portion of light (e.g., 35%) of light at or about 795 nm to transmit/pass through when such light is incident upon the thin film coating at a narrow grazing angle (e.g., $10^{-3}$ radians). The example shown in merely exemplary and the thin film coating 108, 308, 508, 608, 708 may be designed (e.g., materials selected for the layers, layer thicknesses, refractive indexes, etc.) so that it reflects light of one or more different wavelengths and transmits light of one or more different wavelengths.

Figure 9:
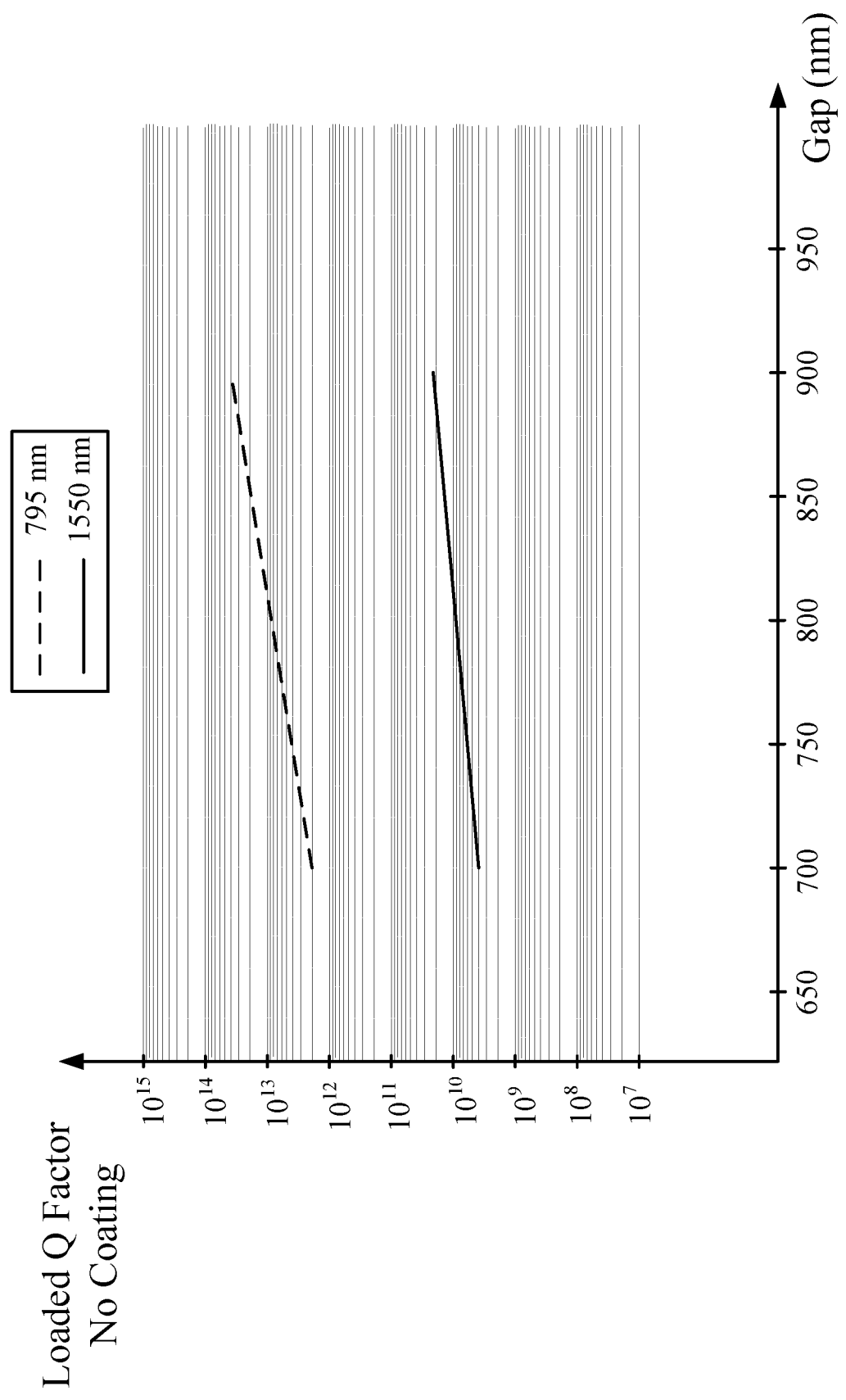
FIG. 9 illustrates an exemplary graph of loaded Q factor versus gap size for light of two different wavelengths when no thin film coating is applied to the bottom surface of the coupler.

FIG. 9 illustrates an exemplary graph of loaded Q factor versus gap size (i.e., distance d between coupler 104 and resonator 106 shown in FIGS. 1, 2, 3, 5, and 6) for light of two different wavelengths (e.g., 795 nm and 1550 nm) when no thin film coating 108 is applied to the bottom surface 105 of the coupler 104 (see FIG. 1). In the example shown, the 795 nm light has a loaded Q factor that is almost 3 orders of magnitude greater than the loaded Q factor of the 1550 nm light across a range of gap sizes.

Figure 10:
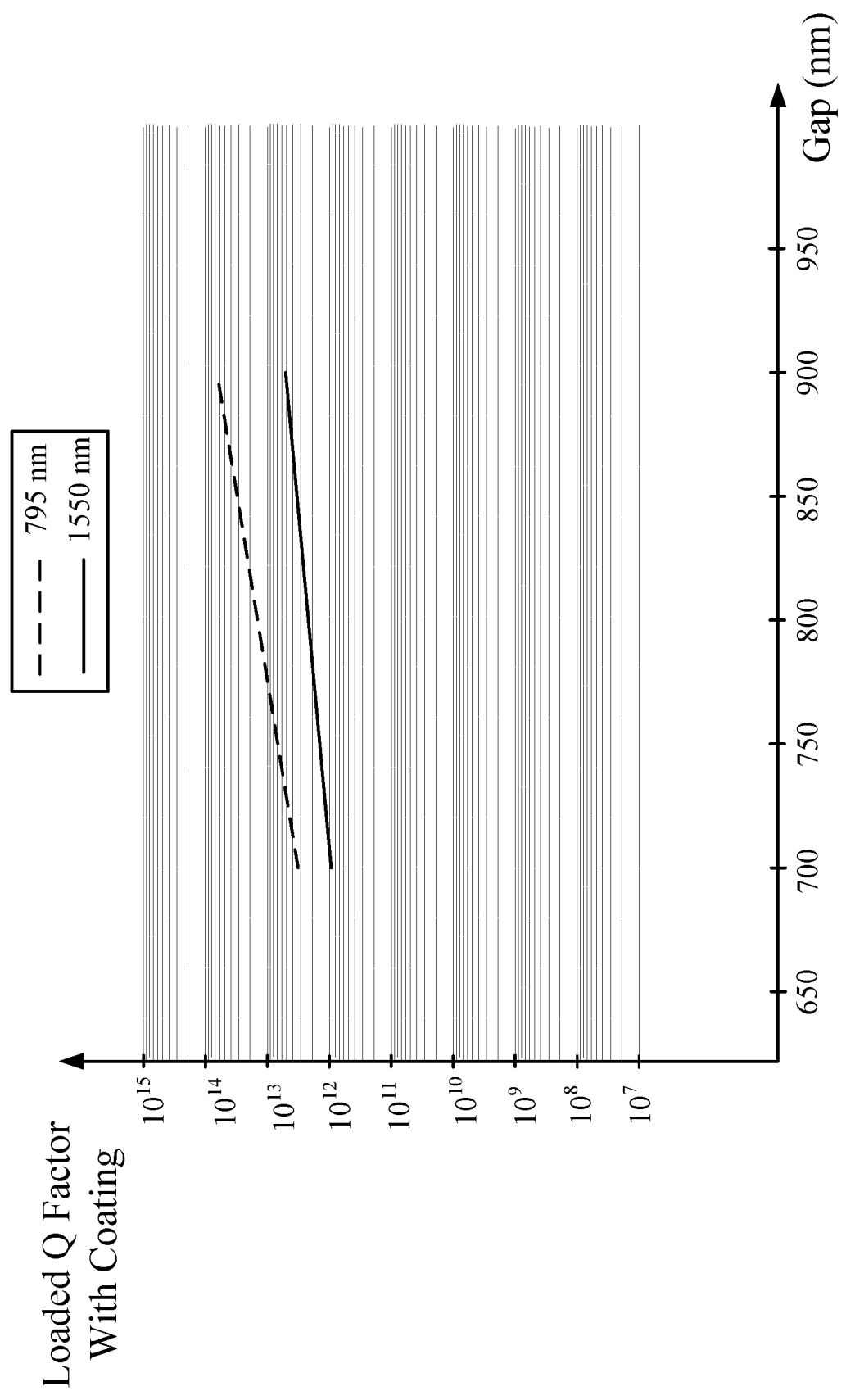
FIG. 10 illustrates an exemplary graph of loaded Q factor versus gap size for the two wavelengths of light when a thin film coating has been applied to the bottom surface of the coupler.

FIG. 10 illustrates an exemplary graph of loaded Q factor versus gap size for the two wavelengths of light shown in FIG. 9 when a thin film coating 108, 308, 508, 608, 708 has been applied to the bottom surface 105 of the coupler 104 (see e.g., FIGS. 1-7). In the example provided, the thin film coating 108, 308, 508, 608, 708 is designed to reflect 1550 nm light and transmit 795 nm light. For instance, the thin film coating 108, 308, 508, 608, 708 may have the trans-mittance properties shown in FIG. 8. Referring to FIGS. 2, 6, and 10, the thin film coating decreases coupling efficiency of the 1550 nm wavelength light between the coupler 104 and the resonator 106, which increases the loaded Q factor at that wavelength of light. Thus, referring to FIGS. 9 and 10, the loaded Q factor of the 1550 nm wavelength light in a system having the thin film coating (see FIG. 10) is significantly boosted compared to the loaded Q factor of such light for a system not having the coating (see FIG. 9). The boosted loaded Q factor of the 1550 nm light better matches the loaded Q factor of the 795 nm light so that the loaded Q factor difference between the two is only off by, for example, a factor of four or less instead of two to three orders of magnitude.

Figure 11:
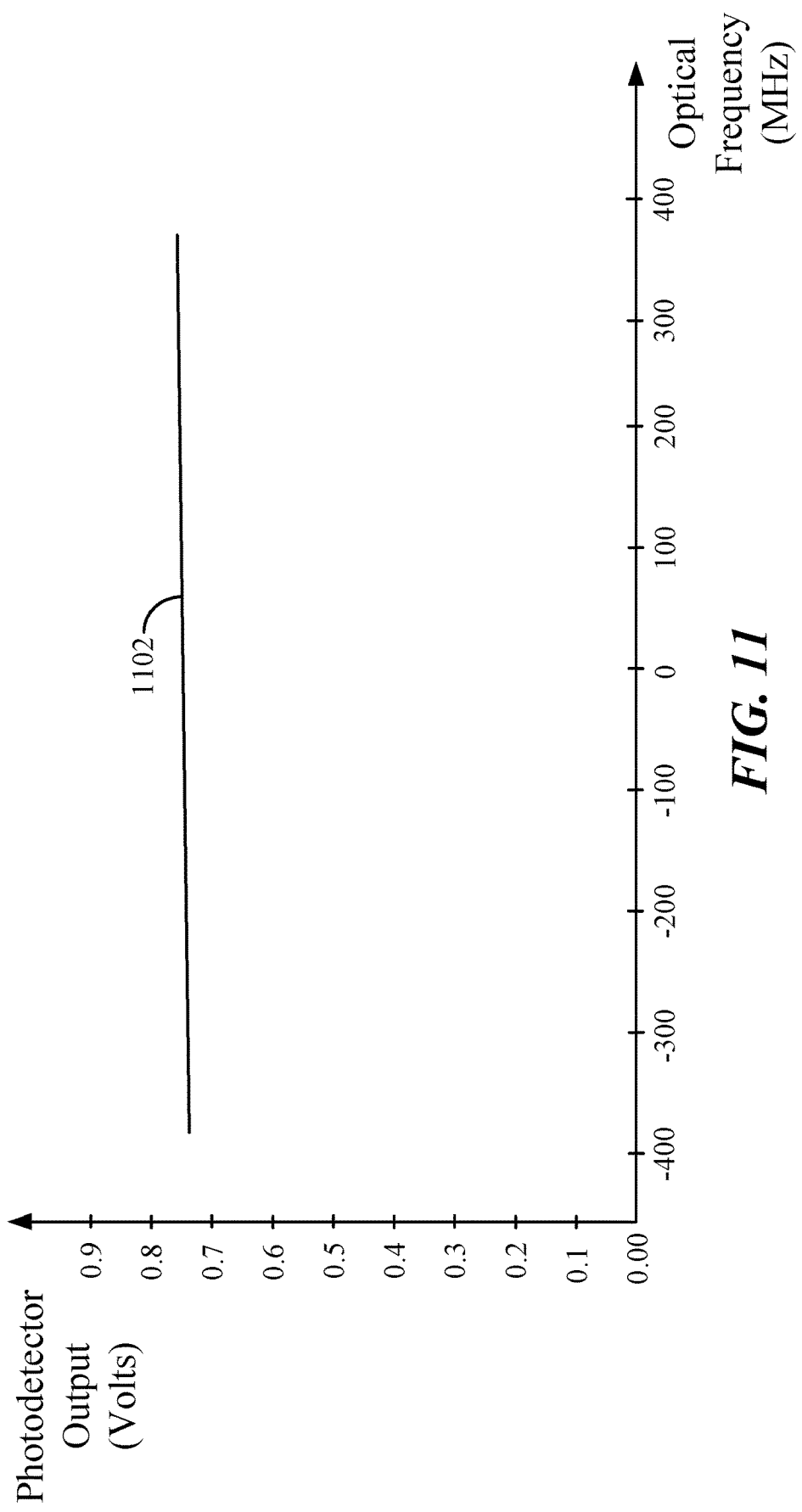
FIG. 11 illustrates an exemplary graph of a photodetector's output voltage versus the offset optical frequency of 795 nm wavelength light propagating through the system shown in FIG. 1 where a coupler has a thin film coating applied to its bottom surface near an open dielectric resonator.

FIG. 11 illustrates an exemplary graph of a photodetector's output voltage versus the offset optical frequency of 795 nm wavelength light propagating through the system shown in FIG. 1 where a coupler has a thin film coating 108 applied to its bottom surface 105 near an open dielectric resonator 106. In the example shown, it is assumed that the distance d between the coupler 104 and the resonator 106 (see FIG. 1) is optimized for evanescently coupling 795 nm light and the thin film coating 108 is designed to reflect 1550 nm light (e.g., exhibits the transmittance profile shown in FIG. 8). The graph in FIG. 11 shows that the relative intensity of the 795 nm light is about 0.75 volts from about −400 MHz to +400 MHz centered around the optical frequency of the 795 nm light.

Figure 12:
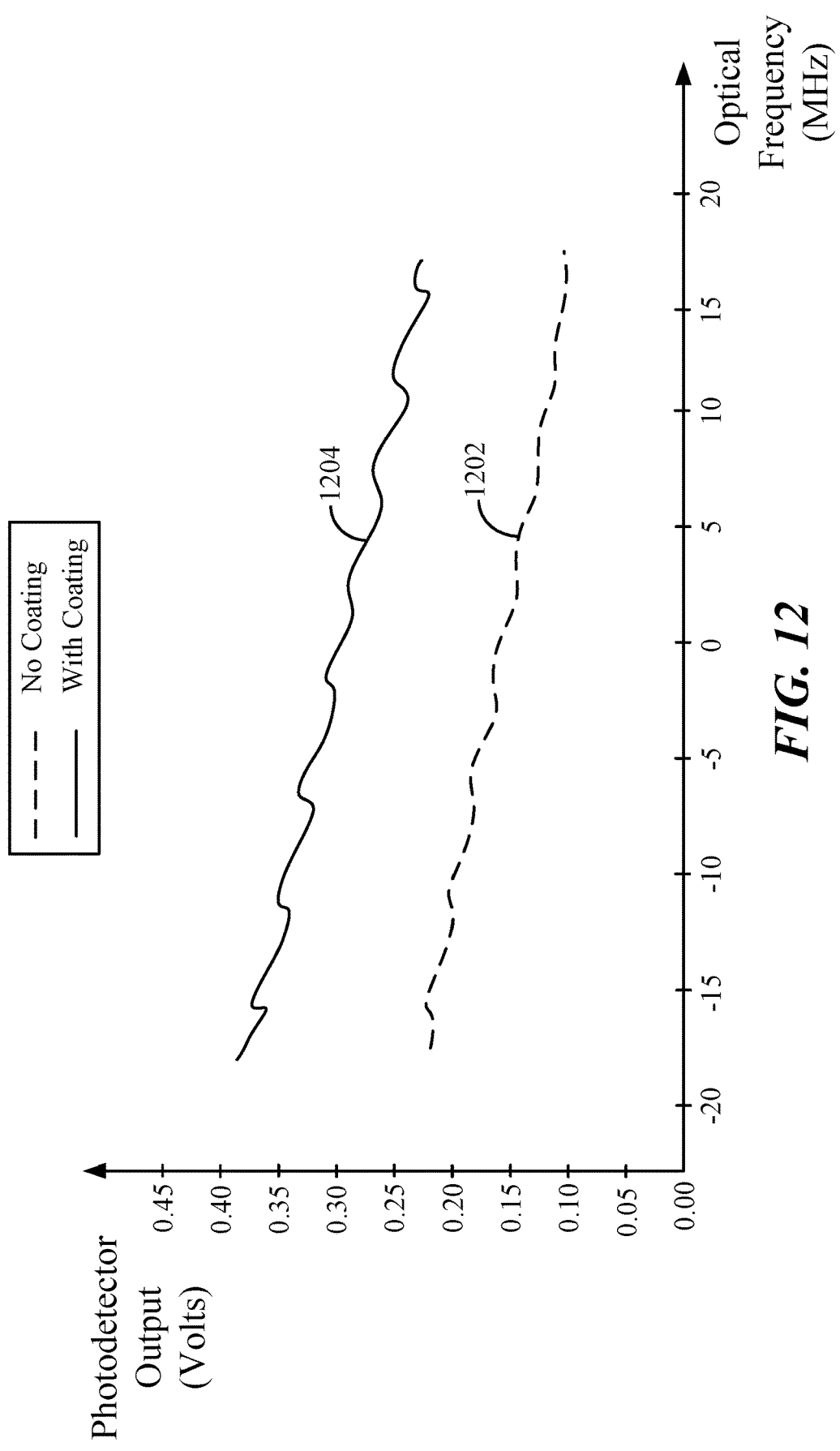
FIG. 12 illustrates an exemplary graph of the photodetector's output voltage versus the offset optical frequency of 1550 nm wavelength light propagating through the system shown in FIG. 1 for the case where a coupler has a thin film coating applied to its bottom surface near an open dielectric resonator 106 and for the case where no thin film coating is applied.

FIG. 12 illustrates an exemplary graph of the photodetector's output voltage versus the offset optical frequency of 1550 nm wavelength light propagating through the system shown in FIG. 1 for the case where a coupler has a thin film coating 108 applied to its bottom surface 105 near an open dielectric resonator 106 and for the case where no thin film coating 108 is applied. In the example shown, it is assumed that the distance d between the coupler 104 and the resonator 106 (see FIG. 1) is optimized for evanescently coupling 795 nm light and the thin film coating 108 when applied is designed to reflect 1550 nm light (e.g., exhibits the transmittance profile shown in FIG. 8). The graph in FIG. 12 shows that the relative intensity of the 1550 nm light has a range between 0.22 volts and 0.10 volts from about −18 MHz to +18 MHz centered around the optical frequency of the 1550 nm light for the case where no thin film coating 108 is applied to the coupler 104. By contrast, the relative intensity of the 1550 nm light is boosted and has a range between 0.38 volts and 0.23 volts from about −18 MHz to +18 MHz centered around the optical frequency of the 1550 nm light for the case where the thin film coating 108 is applied. While the relative intensity of the 1550 nm light with the thin film coating 108 is still not as strong as the relative intensity of the 795 nm light shown in FIG. 11, its relative intensity is still significantly greater than if no thin film coating 108 had been applied.

Thus, the thin film coating 108 allows for loaded quality factor Q equalization for two different wavelengths of light for evanescently coupled resonator systems even though such a system's coupler and resonator are spaced apart a fixed distance d that is optimized for only one wavelength.

Figure 13:
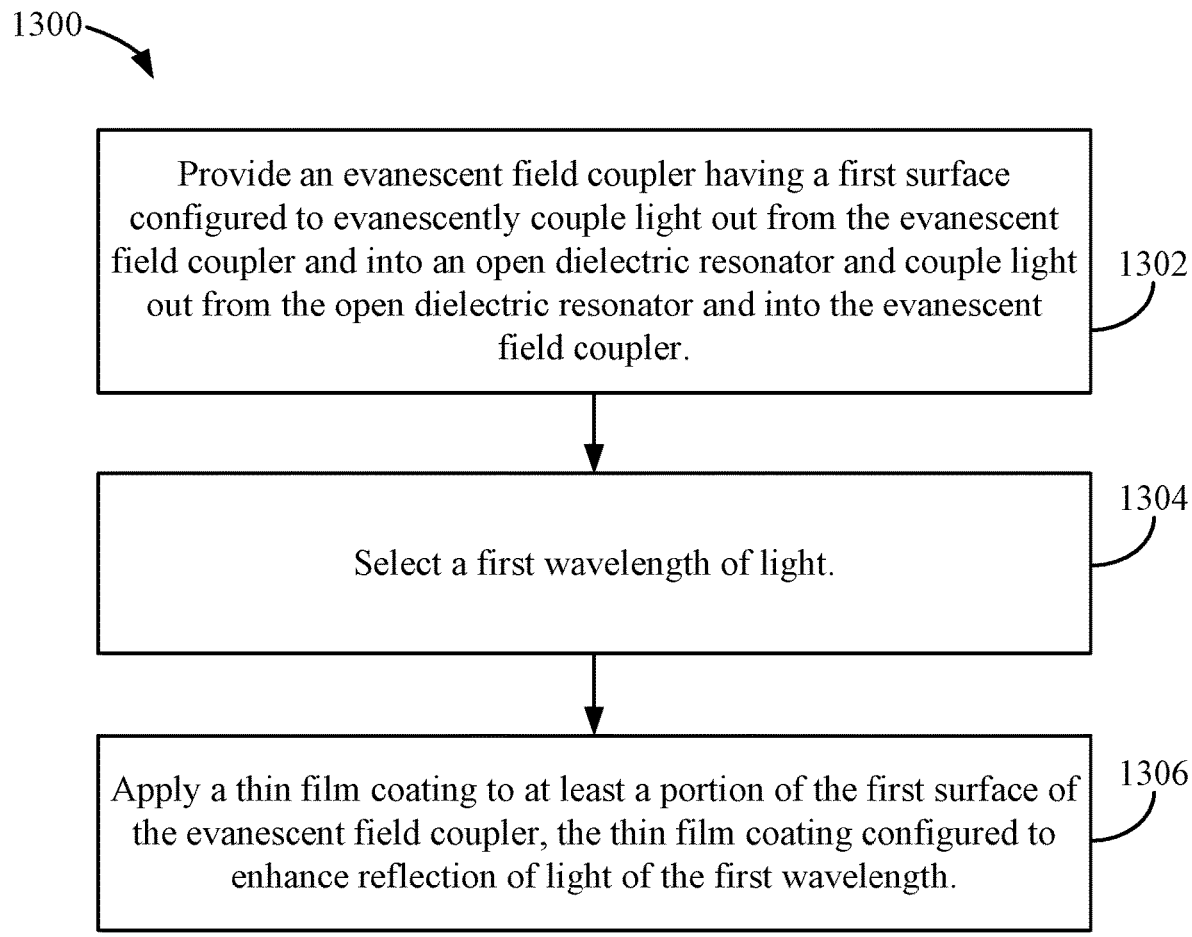
FIG. 13 illustrates a method for manufacturing an apparatus that allows for the wavelength dependent coupling of light into and out of an open dielectric resonator according to one aspect.

FIG. 13 illustrates a method 1300 for manufacturing an apparatus that allows for the wavelength dependent coupling of light into and out of an open dielectric resonator according to one aspect. First, an evanescent field coupler is provided 1302 having a first surface that is configured to evanescently couple light out from the evanescent field coupler and into an open dielectric resonator and couple light out from the open dielectric resonator and into the evanescent field coupler. Next, a first wavelength of light may be selected 1304. Then, a thin film coating is applied to at least a portion of the first surface of the evanescent field coupler, where the thin film coating is configured to enhance reflection of light of the first wavelength.

A coupler having the above described coating may be used in various systems. For example, such a device may be used for efficient lossless retrieval of photons at any wavelength from cavity modes. This may be useful in nonlinear optics systems such as frequency doubling. As another example, such a device may be used to stabilize an open dielectric resonator operating at one wavelength to a reference laser operating at a significantly different wavelength. This is useful for stabilizing lasers and oscillators. As yet another example, such a device may be used to create a wavelength profile of Q factor to achieve operational improvement of an intracavity mode locked laser/frequency comb generator.

One or more of the components, steps, features, and/or functions illustrated in FIGS. 1, 2, 3, 4, 5, 6, 7, 8, 9, 10, 11, 12, and/or 13 may be rearranged and/or combined into a single component, step, feature or function or embodied in several components, steps, or functions. Additional elements, components, steps, and/or functions may also be added without departing from the invention. The apparatus, devices, and/or components illustrated in FIGS. 1, 2, 3, 4, 5, 6, and/or 7 may be configured to perform one or more of the methods, features, or steps described in FIGS. 8, 9, 10, 11, 12, and/or 13.

Also, it is noted that the aspects of the present disclosure may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An apparatus comprising:
   an evanescent field coupler having a first surface configured to evanescently couple light between the evanescent field coupler and an open dielectric resonator; and
   a thin film coating covering at least a portion of the first surface of the evanescent field coupler and configured to increase reflection of light of a first wavelength, wherein the thin film coating is further configured to decrease the coupling efficiency of light of the first wavelength and boost a loaded quality factor Q of light of the first wavelength propagating within the open dielectric resonator.

2. The apparatus of claim 1, wherein the thin film coating is configured to increase reflection of light of the first wavelength relative to light of a second wavelength that is different than the first wavelength.

3. The apparatus of claim 1, wherein the thin film coating includes a plurality of layers.

4. The apparatus of claim 3, wherein the plurality of layers includes a first set of layers composed of a first material and a second set of layers composed of a second material, the first set of layers interleaved with the second set of layers to form an alternating layer structure.

5. The apparatus of claim 4, wherein the first material and the second material have different indexes of refraction, and the refractive index of the first material, the refractive index of the second material, and a selected thickness of each layer of the plurality of layers cause constructive interference of light of the first wavelength at the thin film coating to increase reflection of light of the first wavelength when light of the first wavelength is incident upon the first surface of the coupler and/or a surface of the open dielectric resonator at a grazing angle less than 0.1 radians.

6. The apparatus of claim 3, wherein the plurality of layers each have at least one of a different thickness and/or a different index of refraction.

7. The apparatus of claim 1, the thin film coating is configured to increase reflection of light of the first wavelength when light of the first wavelength is incident upon the first surface of the coupler and/or a surface of the open dielectric resonator at a grazing angle less than 0.1 radians.

8. The apparatus of claim 1, wherein the thin film coating operates as a wavelength selective dielectric mirror that reflects more than 90% of the power of the light of the first wavelength.

9. The apparatus of claim 1, wherein the evanescent field coupler is a prism or a waveguide.

10. A method comprising:
    providing an evanescent field coupler having a first surface configured to evanescently couple light out from the evanescent field coupler and into an open dielectric resonator and couple light out from the open dielectric resonator and into the evanescent field coupler;
    selecting a first wavelength of light; and
    applying a thin film coating to at least a portion of the first surface of the evanescent field coupler, the thin film coating configured to enhance reflection of light of the first wavelength, wherein the thin film coating is further configured to decrease the coupling efficiency of light of the first wavelength and boost a loaded quality factor Q of light of the first wavelength propagating within the open dielectric resonator.

11. The method of claim 10, further comprising:
    selecting and adjusting one or more thin film coating properties of the thin film coating to enhance reflection of light of the first wavelength.

12. The method of claim 11, wherein the thin film coating properties include a number of layers of the thin film coating, a material for each layer of the thin film coating, an index of refraction for each layer of the thin film coating, and a thickness for each layer of the thin film coating.

13. The method of claim 10, wherein the thin film coating is configured to increase reflection of light of the first wavelength relative to light of a second wavelength that is different than the first wavelength.

14. The method of claim 10, wherein applying a thin film coating includes:
    forming a plurality of alternating layers over the portion of the first surface of the evanescent field coupler.

15. The method of claim 14, wherein the plurality of alternating layers are each composed of one of two different materials and each layer of the plurality of layers has a different thickness.

16. The method of claim 10, wherein applying a thin film coating includes:

forming a plurality of layers over the portion of the first surface of the evanescent field coupler, each layer of the plurality of layers having a different index of refraction for a given wavelength of light.

17. A system comprising:

a light source configured to generate coherent light having a first wavelength and a second wavelength, the second wavelength substantially different than the first wavelength;

an open dielectric resonator; and an evanescent field coupler having a first surface configured to evanescently couple light between the evanescent field coupler and the open dielectric resonator and a second surface through which the evanescent field coupler transmits and receives light to and from the light source, wherein the evanescent field coupler's first surface includes a thin film coating that is configured to decrease light coupling efficiency between the evanescent field coupler and the open dielectric coupler for light of the first wavelength relative to light coupling efficiency of the second wavelength, and the thin film coating further configured to boost loaded quality factor Q for light of the first wavelength within the open dielectric resonator.

18. The system of claim 17, wherein the open dielectric resonator is a monolithic whispering gallery mode resonator.

19. The system of claim 17, wherein the thin film coating includes a plurality of layers for which thin film coating properties are selected to increase reflectance of light of the first wavelength through the thin film coating relative to light of the second wavelength through the thin film coating.

* * * * *